US007045266B2

(12) United States Patent
Mase et al.

(10) Patent No.: US 7,045,266 B2
(45) Date of Patent: May 16, 2006

(54) LITHOGRAPHIC PRINTING PLATE

(75) Inventors: Hiroshi Mase, Sodegaura (JP); Sumio Hirose, Sodegaura (JP); Yuko Suzuki, Sodegaura (JP); Katsuru Matsumoto, Kyoto (JP); Takayuki Sanada, Sodegaura (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

(21) Appl. No.: 10/009,640

(22) PCT Filed: Apr. 26, 2001

(86) PCT No.: PCT/JP01/03658

§ 371 (c)(1),
(2), (4) Date: Dec. 14, 2001

(87) PCT Pub. No.: WO01/83234

PCT Pub. Date: Nov. 8, 2001

(65) Prior Publication Data

US 2002/0192590 A1 Dec. 19, 2002

(30) Foreign Application Priority Data

Apr. 28, 2000 (JP) ............................ 2000-130530
Nov. 9, 2000 (JP) ............................ 2000-341457

(51) Int. Cl.
*G03F 7/04* (2006.01)

(52) U.S. Cl. .............................. 430/270.1; 430/281.1; 430/282.1; 430/283.1; 430/284.1; 430/286.1; 430/287.1; 430/288.1; 430/302; 430/494; 101/453; 101/463.1; 101/466; 101/467

(58) Field of Classification Search ................ 430/138, 430/270.1, 281.1–288.1, 302, 306, 348, 494, 430/944, 945, 964; 101/453, 463.1, 465, 101/466, 467
See application file for complete search history.

(56) References Cited

U.S. PATENT DOCUMENTS 3,476,937 A 11/1969 Vrancken ..................... 250/65
3,793,033 A 2/1974 Mukherjee ................... 96/115
3,877,948 A 4/1975 Yonezawa et al.
4,001,015 A 1/1977 Barzynski et al. ............. 96/33
6,030,750 A * 2/2000 Vermeersch et al. ........ 430/302
6,096,471 A * 8/2000 Van Damme et al. ...... 430/188
6,124,073 A 9/2000 Rompuy et al.
6,190,830 B1 * 2/2001 Leon et al. .............. 430/270.1
6,230,621 B1 * 5/2001 Verschueren et al. ....... 101/453
6,300,032 B1 * 10/2001 Van Damme et al. ...... 430/188

FOREIGN PATENT DOCUMENTS

| | | | |
|---|---|---|---|
| DE | GB 1 357 168 | A | 6/1974 |
| EP | 0 922 572 | A1 | 6/1999 |
| JP | 47-8657 | A | 5/1972 |
| JP | 56-130753 | A | 10/1981 |
| JP | A-60-052932 | | 3/1985 |
| JP | A-6-199064 | | 7/1994 |
| JP | A-7-1850 | | 1/1995 |
| JP | A-7-20629 | | 1/1995 |
| JP | A-7-314934 | | 12/1995 |
| JP | A-8-282142 | | 10/1996 |
| JP | A-9-127683 | | 5/1997 |
| JP | A-9-171249 | | 6/1997 |
| JP | 9-218506 | A | 8/1997 |
| JP | 9-244237 | A | 9/1997 |
| JP | 11-240273 | A | 9/1999 |
| JP | 2001-22066 | A | 1/2001 |

* cited by examiner

*Primary Examiner*—Barbara L. Gilliam
(74) *Attorney, Agent, or Firm*—Birch, Stewart, Kolasch & Birch

(57) ABSTRACT

A lithographic printing original plate, a lithographic printing plate using the lithographic printing original plate and a process for producing the lithographic printing plate are disclosed. The lithographic printing original plate has, on a substrate, a photosensitive layer made of a crosslinked polymer comprising a hydrophilic polymer, a crosslinking agent and a light absorbing compound or comprising a hydrophilic polymer, a crosslinking agent, a light absorbing compound and a hydrophobic polymer, and has properties that the photosensitive layer is changed from ink-repellent to ink-receptive by irradiation with a light.

15 Claims, No Drawings

LITHOGRAPHIC PRINTING PLATE

FIELD OF THE INVENTION

The present invention relates to a printing plate, and more particularly to a lithographic printing plate requiring a fountain solution, which is sensitive to a light of near infrared region, which can be handled even in a bright room, on which drawing can be directly made by a laser beam, which does not need operations of development and wiping-off, and which is excellent in various printing properties.

BACKGROUND OF THE INVENTION

Lithographic printing, so-called offset printing, is the mainstream in the printing on paper and is widely used. Printing plates for use in the offset printing have been heretofore produced as follows: a printing original is temporarily output on paper or the like, then the original is photographed to prepare a comprehensive film, and through the comprehensive film a photosensitive original plate is exposed and developed.

However, with recent digitization of information and increase of laser power, a process wherein drawing is directly made on an original plate by laser scanning to prepare a printing plate without using the comprehensive film, a so-called CTP (Computer To Plate) process, has been put into practical use in the production of printing plates.

As the plate for the CTP process practically used at present, there is a photopolymer type plate using photo-reaction due to a visible light of about 500 nm. This plate, however, has problems that the plate needs development, has poor resolution and cannot be handled in a bright room.

In order to solve such problems, a plate using thermal reaction due to a light of near infrared region is disclosed in Japanese Patent Laid-open Publication No. 20629 (1995), and this plate has been already on the market.

Although this plate can be certainly handled in a bright room and has excellent resolution, it still needs a process of development.

In Japanese Patent Laid-Open Publication No. 282142 (1996), a plate having a non-image area formed from a hydrophilic swelling layer is disclosed. In this plate, a hydrophilic swelling layer is formed, and a photosensitive material is absorbed by the hydrophilic swelling layer to allow the layer to have photosensitivity. In the image area, the photosensitive material in the hydrophilic swelling layer undergoes reaction by exposure to light and the image area loses hydrophilicity, but the ink receptivity is not sufficient. On the other hand, the photosensitive material remains in the non-image area, and after the exposure, rinsing to remove the photosensitive material from the non-image area is necessary.

As a plate which does not need a process of development, a plate comprising a substrate having provided thereon an inorganic light absorbing layer comprising titanium or titanium oxide and an ink-repellent layer made of a silicone resin in this order is disclosed in Japanese Patent Laid-Open Publication No. 314934(1995), and also this plate has been already on the market. In this plate the silicone resin layer repels an ink and becomes a non-image area, while an image area is formed by irradiation with a near infrared light. The silicone resin layer is removed by the irradiation with a light to expose the ink-receptive substrate surface outside. In order to completely remove the silicone resin layer, wiping-off is necessary, and if the wiping-off of the silicone resin is insufficient, an ink receptivity on the irradiated area is not sufficient to cause defects in the image area, and printing is not made satisfactorily.

In Japanese Patent Laid-Open Publication No. 199064 (1994), there is disclosed a plate consisting of a substrate, a light absorbing layer provided thereon in which carbon black is dispersed in nitro cellulose, and a hydrophilic layer or an ink-repellent layer laminated on the light absorbing layer. In this plate, the light absorbing layer is thermally decomposed upon irradiation with a light, and the light absorbing layer and the hydrophilic layer or the ink-repellent layer provided thereon are removed to expose the ink-receptive substrate surface outside. That is, imaging area is made by so-called ablation. This plate can be handled even in a bright room and does not need operations of development and wiping-off. However, great energy is necessary to remove the light absorbing layer and the hydrophilic layer or the ink-repellent layer provided thereon, and a long period of time is necessary for the exposure. Moreover, there is a problem that a part of the thus removed light absorbing layer, hydrophilic layer or ink-repellent layer provided Whereon and their decomposition products accumulate on the unexposed hydrophilic layer or ink-repellent layer around the exposed area, to cause deterioration of qualities such as adhesion of an ink.

As a no ablation plate, technique such that a photosensitive layer comprising hydroxyethyl cellulose, a phenol resin and a photo-radical generator is cured by irradiation with a light and thereby becomes lipophilic is disclosed in U.S. Pat. No. 3,793,033. In this plate, however, the balance between the hydrophilicity and the lipophilicity after the irradiation with a light is bad and fine printing cannot be made.

In Japanese Patent Laid-Open Publication No. 52932 (1985), there is disclosed a plate such that a surface of a non-water-absorbing resin layer is sulfonated to make the surface hydrophilic and the sulfonated surface layer is removed by irradiation with a light to make the layer lipophilic. In this case, ablation is used, but only the surface layer is ablated, so that debris scarcely occurs. From this viewpoint, this plate has been improved, but the plate is unfavorable because the hydrophilicity is insufficient, scumming tends to occur, and the sulfonation process is complicated and dangerous.

In Japanese Patent Laid-Open Publications No. 127683 (1997) and No. 171249 (1997), there are disclosed plates comprising a hydrophilic support and a photosensitive layer made from an aqueous dispersion of thermoplastic polymer particles which are softened and/or melted by exposure to light and changed to ink-receptive. The unexposed area of the photosensitive layer of these plates is soluble in water and is easily removable, so that an exclusive developing machine is unnecessary and development can be carried out on a printing press using a fountain solution. That is, these plates have been put into practical use as those for on-press development system. In the on-press development, however, there reside problems that the fountain solution and the ink are contaminated and strict control of the moisture of the plate is required.

As a plate which needs neither wet development nor on-press development, a plate having a hydrophilic resin layer containing hydrophobic thermoplastic polymer particles which are independent from one another and in contact with one another, said hydrophobic polymer particles being melted by heat to change hydrophilicity of the resin layer, is disclosed in U.S. Pat. No. 3,476,937. However, when drawing is made on the plate by irradiation with a light, the sensitivity is low, and the hydrophilic resin layer has low mechanical strength and durability of the plate is poor. Moreover, if the amount of the hydrophobic thermoplastic polymer is increased to improve the ink receptivity, scumming is liable to take place.

In Japanese Patent Laid-Open Publication No. 1850 (1995), there is disclosed a plate having a photosensitive layer comprising a hydrophilic resin and microcapsules contained in the resin, said microcapsules containing a lipophilic material that is reactive to hydrophilic groups of the hydrophilic resin, and there is also disclosed technique of irradiating the plate with a light to rupture the microcapsules and to change the hydrophilic resin to lipophilic. In this technique, however, to increase resolution or to prevent scumming, the diameters of the microcapsules must be decreased, and it is very difficult to produce the microcapsules. In the printing using thermal head, the microcapsules are ruptured relatively easily by heat and pressure, but in the printing using irradiation with a light, the microcapsules are not ruptured uniformly and the resolution is bad.

Further, there has been proposed a process wherein a substrate with a light absorbing layer containing a resin or the like formed thereon is brought into close contact with another substrate and irradiated with a light to transfer the light absorbing layer to another substrate using heat generated by the irradiation. However, there are various problems in this process, for example, it is difficult to bring the substrates into close contact with each other because dust or the like attaches to the substrates, great energy is necessary for the transferring, and the transferred light absorbing layer has low mechanical strength and comes away during the printing.

As described above, the conventional CTP printing plates have various problems, and therefore, development of CTP printing plates to solve the problems has been desired strongly.

The present invention is intended to solve such problems associated with the prior art as described above, and it is an object of the invention to provide a printing original plate which can be handled in a bright room, does not need operations of development and wiping-off and is excellent in sensitivity, resolution and various printing properties and is used for a CTP printing plate, and to provide a printing plate using the printing original plate and a process for producing the printing plate.

DISCLOSURE OF THE INVENTION

The present inventors have earnestly studied to solve such problems as mentioned above, and as a result, have found that the problems can be solved by a lithographic printing original plate, which has on a substrate a photosensitive layer made of a crosslinked polymer having ink repellency and has properties that the photosensitive layer is changed from ink-repellent to ink-receptive by irradiation with a light, and a lithographic printing plate using the original plate. Based on the founding, the present invention has been accomplished.

That is to say, according the first invention, there is provided a lithographic printing original plate having a photosensitive layer on a substrate directly or on an another layer provided thereon, said photosensitive layer being made of a crosslinked polymer having ink repellency, and having properties that the photosensitive layer is changed from ink-repellent to ink-receptive by irradiation with a light.

According to the second invention, there is provided the lithographic printing original plate of the first invention wherein the photosensitive layer is a photosensitive hydrophilic resin layer obtained by crosslinking a photosensitive composition comprising a hydrophilic polymer, a crosslinking agent and a light absorbing compound.

According to the third invention, there is provided the lithographic printing original plate of the first invention wherein the photosensitive layer is a photosensitive hydrophilic resin layer obtained by crosslinking a photosensitive composition comprising a hydrophilic polymer, a crosslinking agent, a light absorbing compound and a hydrophobic polymer.

According to the fourth invention, there is provided the lithographic printing original plate of the second invention wherein the photosensitive hydrophilic resin layer has a phase separation structure consisting of a hydrophilic polymer phase and a hydrophobic polymer phase.

According to the fifth invention, there is provided the lithographic printing original plate of the third invention wherein the hydrophilic polymer is a polymer containing as a main component one or more monomers selected from unsubstituted or substituted (meth)acrylamide, N-vinylformamide and N-vinylacetamide, the hydrophobic polymer is an aqueous dispersion polymer having an average particle diameter of 0.005 to 0.5 μm and a film forming temperature of not higher than 50° C., and the photosensitive hydrophilic resin layer has a phase separation structure consisting of a hydrophilic polymer phase and a hydrophobic polymer phase.

According to the sixth invention, there is provided the lithographic printing original plate of the fourth or the fifth invention wherein the photosensitive layer is locally foamed by irradiation with a light and changed from ink-repellent to ink-receptive.

According to the seventh invention, there is provided a process for producing a lithographic printing plate, comprising irradiating the lithographic printing original plate of the fifth or the sixth invention with a light having a wavelength of 750 to 1100 nm.

According to the eighth invention, there is provided a lithographic printing plate obtained by irradiating a lithographic printing original plate having a photosensitive layer disposed on a substrate directly or on an another layer provided thereon, said photosensitive layer being made of a crosslinked polymer having ink repellency, with a light to change the photosensitive layer from ink-repellent to ink-receptive.

According to the ninth invention, there is provided the lithographic printing plate of the eighth invention wherein the photosensitive layer is a photosensitive hydrophilic resin layer obtained by crosslinking a photosensitive composition comprising a hydrophilic polymer, a crosslinking agent and a light absorbing compound.

According to the tenth invention, there is provided the lithographic printing plate of the eighth invention wherein the photosensitive layer is a photosensitive hydrophilic resin layer obtained by crosslinking a photosensitive composition comprising a hydrophilic polymer, a crosslinking agent, alight absorbing compound and a hydrophobic polymer.

According to the eleventh invention, there is provided the lithographic printing plate of the ninth invention wherein the photosensitive hydrophilic resin layer has a phase separation structure consisting of a hydrophilic polymer phase and a hydrophobic polymer phase.

According to the twelfth invention, there is provided the lithographic printing plate of the tenth invention wherein the hydrophilic polymer is a polymer containing as a main component one or more monomers selected from unsubstituted or substituted (meth)acrylamide, N-vinylformamide and N-vinylacetamide, the hydrophobic polymer is an aqueous dispersion polymer having an average particle diameter of 0.005 to 0.5 μm and a film forming temperature of not higher than 50° C., and the photosensitive hydrophilic resin layer has a phase separation structure consisting of a hydrophilic polymer phase and a hydrophobic polymer phase.

According to the thirteenth invention, there is provided the lithographic printing plate of the eleventh or the twelfth invention wherein the photosensitive layer is locally foamed by irradiation with a light and changed from ink-repellent to ink-receptive.

According to the fourteenth invention, there is provided the lithographic printing plate of the twelfth or the thirteenth invention wherein the light for the irradiation has a wavelength of 750 to 1100 nm.

PREFERRED EMBODIMENTS OF THE INVENTION

The lithographic printing original plate according to the invention, the lithographic printing plate using the original plate and the process for producing the lithographic printing plate are described in detail hereinafter.

(1) Lithographic Printing Original Plate and Lithographic Printing Plate

(i) Substrate

In the lithographic printing original plate of the invention, a photo sensitive layer made of a crosslinked polymer having ink repellency is provided on a substrate directly or on an another layer provided thereon. Examples of the substrates used herein include metallic plates, such as aluminum plate, steel plate, stainless steel plate and copper plate, plastic films, such as films of polyester, nylon, polyethylene, polypropylene, polycarbonate and ABS resin, paper, aluminum foil laminated paper, metal deposited paper, and plastic film laminated paper. Although there is no specific limitation on the thickness of the substrate, the thickness is in the range of usually 100 to 400 μm. In order to improve adhesion properties, the substrate may be subjected to surface treatment, such as oxidation treatment, chromate treatment, sandblasting treatment and corona discharge treatment.

(ii) Photosensitive layer

Next, the photosensitive layer of the invention which is made of a crosslinked polymer having ink repellency is described in detail.

The lithographic printing plate of the invention is a printing plate for offset printing using a fountain solution, and its non-image area is covered with the fountain solution and thereby repels an ink. Therefore, the photosensitive layer of the invention needs to be hydrophilic and insoluble in water. In the plate of the invention, the photosensitive layer is changed from hydrophilic to ink-receptive without removing the light irradiated area of the photosensitive layer by ablation. Hence, the printing plate of the invention does not need operations of development and wiping-off after the irradiation with a light. In order to embody the above-mentioned property change, the photosensitive layer of the invention is preferably obtained by applying a photosensitive composition comprising a hydrophilic polymer, a crosslinking agent and a light absorbing compound onto a substrate and then crosslinking the composition, or by applying a photosensitive composition comprising a hydrophilic polymer, a crosslinking agent, a hydrophobic polymer and a light absorbing compound onto a substrate and then crosslinking the composition. The photosensitive layer particularly preferable has a phase separation structure consisting of a hydrophilic polymer phase and a hydrophobic polymer phase. By the crosslinking, the hydrophilic polymer becomes water-insoluble.

In the photosensitive layer of the invention, the hydrophilic polymer is crosslinked to form a hydrophilic polymer phase, and when the photosensitive composition contains a hydrophobic polymer, the hydrophobic polymer forms a hydrophobic polymer phase. As a result, the photosensitive layer has a phase separation structure. On the other hand, even when the photosensitive composition contains no hydrophobic polymer, if the crosslinking agent undergoes self-polymerization as described later, the self-polymerization product of the crosslinking agent forms a hydrophobic polymer phase. As a result, the photosensitive layer has a phase separation structure. Upon irradiation with a light, the hydrophobic polymer phase is foamed or heat melted, whereby the photosensitive layer loses hydrophilicity and is changed to ink-receptive.

(a) Hydrophilic Polymer

The hydrophilic polymer used for the photosensitive layer of the invention has a hydrophilic group and a functional group that is reactive to the crosslinking agent.

Examples of the hydrophilic groups of the hydrophilic polymer include hydroxyl group, carboxyl group and its alkali metal, alkaline earth metal or amine salt, sulfonic group and its alkali metal, alkaline earth metal or amine salt, phosphoric group and its alkali metal, alkaline earth metal or amine salt, amide group, amine group, sulfonamide group, oxymethylene group, and oxyethylene group.

Examples of the functional groups reactive to the crosslinking agent include hydroxyl group, carboxyl group and its alkali metal, alkaline earth metal or amine salt, sulfonic group and its alkali metal, alkaline earth metal or amine salt, phosphoric group and its alkali metal, alkaline earth metal or amine salt, amide group, amine group, isocyanate group, glycidyl group, oxazoline group, methylol group, and methoxymethyl or butoxymethyl group which is obtainable by condensing methylol group with alcohol such as methanol or butanol.

Examples of the hydrophilic polymers include the following water-soluble polymers.

That is, there can be mentioned celluloses, gelatin, polymers obtained by saponification of polyvinylacetate, polymers obtained by polymerization of unsaturated acids and their derivatives having the aforesaid hydrophilic groups or crosslinking functional groups, N-vinylacetamide, N-vinylformamide, N-vinylpyrrolidone, vinyl acetate, vinyl ether; and polymers obtained by hydrolysis of these polymers. Of these, preferable are polymers obtained by polymerization of unsaturated acids and their derivatives having the aforesaid hydrophilic groups or crosslinking functional groups, N-vinylacetamide and N-vinylformamide, from the viewpoints of ease of crosslinking, ease of obtaining balance between hydrophilicity and water-resisting qualities, and ease of obtaining ink receptivity by irradiation with a light.

The unsaturated acids and their derivatives having the aforesaid hydrophilic groups or crosslinking functional groups are, for example, as follows.

Examples of the unsaturated acid derivatives having hydroxyl group include hydroxyethyl (meth)acrylate, hydroxypropyl (meth)acrylate, hydroxybutyl (meth)acrylate, polyethylene glycol mono(meth)acrylate, methylol (meth)acrylamide, and a condensation product of methylol (meth)acrylamide and methyl alcohol or butyl alcohol, such as methoxymethyl (meth)acrylamide or butoxymethyl (meth)acrylamide.

Examples of the unsaturated acids having carboxyl group include monobasic unsaturated acids, such as (meth) acrylic acid; dibasic unsaturated acids, such as itaconic acid, fumaric acid, maleic acid and anhydrides thereof; and monoesters and monoamides of these dibasic unsaturated acids.

Examples of the unsaturated acids having sulfonic group include sulfoethyl (meth)acrylate, (meth)acrylamidemethylpropanesulfonic acid, vinylsulfonic acid, vinylmethylsulfonic acid, isopropenylmethylsulfonic acid, sulfuric ester of alcohol obtained by addition of ethylene oxide or propylene oxide to (meth) acrylic acid (e.g., Eleminol RS-30 available from Sanyo Kasei Kogyo K.K.) (meth)acryloyloxyethylsulfonic acid, ester of monoalkylsulfosuccinate and a compound having allyl group (e.g., Eleminol JS-2 available from Sanyo Kasei Kogyo K.K., Latemul S-180 and S-180A available from Kao Corporation), reaction product of monoalkylsulfosuccinate and glycidyl (meth)acrylate, and Antox MS60 available from Nippon Nyukazai K.K. Examples of the polymerizable unsaturated monomers having phosphoric group include vinylphosphoric acid, mono (2-hydroxyethyl) phosphate (meth)acrylate and mono (2-hydroxyethyl) (meth)acrylate of monoalkyl phosphate.

The carboxyl group, the sulfonic group and the phosphoric group may be neutralized with an alkali metal, an alkaline earth metal or an amine. Examples of the alkali metals used for neutralization include sodium, potassium and lithium Examples of the alkaline earth metals include calcium and magnesium. Examples of the amines include ammonia, methylamine, dimethylamine, trimethylamine, ethylamine, diethylamine, triethylamine, monoethanolamine, diethanolamine and triethanolamine.

Examples of the unsaturated acid derivatives having amide group include unsubstituted or substituted (meth) acrylamide, unsubstituted or substituted itaconic acid amide and unsubstituted or substituted fumaric acid amide. Examples of the unsubstituted or substituted (meth)acrylamides include (meth)acrylamide, N-methyl (meth)acrylamide, N,N-dimethyl (meth)acrylamide, N-ethyl (meth)acrylamide, N,N-diethyl (meth)acrylamide, N,N-dimethylaminopropyl (meth)acrylamide, N-isopropyl (meth)acrylamide, diacetone (meth)acrylamide, methylol (meth)acrylamide, methoxymethyl (meth)acrylamide, butoxymethyl (meth)acrylamide, propyl sulfonate (meth) acrylamide and (meth)acryloyl morpholine. The dibasic acid amide such as itaconic acid amide may be a monoamide or a diamide by amidation of one carboxyl group or both carboxyl groups. Examples of the unsaturated acid derivatives having glycidyl group include glycidyl (meth)acrylate and paravinylphenyl glycidyl ether.

In the polymerization, one or more compounds of the aforesaid unsaturated acids, derivatives thereof, N-vinylacetamide and N-vinylformamide may be used. Further monomers copolymerizable with the unsaturated acids, derivatives thereof, N-vinylacetamide and N-vinylformamide may be used in combination. Examples of the copolymerizable monomers include methyl (meth)acrylate, ethyl (meth)acrylate, butyl (meth)acrylate, 2-ethylhexyl (meth)acrylate, glycidyl (meth)acrylate, dimethylaminoethyl (meth)acrylate, diethylaminoethyl (meth)acrylate, phenoxyethyl (meth) acrylate, benzyl (meth)acrylate, adamantyl (meth)acrylate, cyclohexyl (meth)acrylate, styrene, $\alpha$-methylstyrene, acrylonitrile, methacrylonitrile and vinyl acetate. The terms "(meth)acryl", "(meth)acryloyl" and "(meth)acrylate" in the (meth)acrylamides and the (meth)acrylic acids mean both of acryl and methacryl, both of acryloyl and methacryloyl, and both of acrylate and methacrylate, respectively.

In the case where the photosensitive layer is made of a photosensitive composition comprising a hydrophilic polymer, a crosslinking agent, a light absorbing compound and a hydrophobic polymer, wherein the hydrophobic polymer mainly forms a hydrophobic polymer phase in the photosensitive layer, and the photosensitive layer becomes ink-receptive upon irradiation with a light while foaming hardly occurs, the hydrophilic polymer of the invention is preferably a polymer containing as a main component one or more monomers selected from unsubstituted or substituted (meth) acrylamides, N-vinvlformamide and N-vinylacetamide, from the viewpoints of ease of change of the photosensitive layer to ink-receptive upon irradiation with a light, and excellent hydrophilicity and water-resisting qualities of the photosensitive layer. Of the substituted (meth)acrylamides, particularly preferable is monomethyl (meth)acrylamide, dimethyl (meth)acrylamide, monoethyl (meth)acrylamide or hydroxymethyl (meth)acrylamide.

The polymer having a great number of am,de groups comes to have a function of a coagulant. Especially when the polymer contains not less than 65% by weight of a monomer having amide group and has acid group such as carboxyl group, sulfonic group or phosphoric group, the coagulation ability of the polymer becomes strong, and in the preparation of a photosensitive composition, the hydrophobic polymer particles are sometimes coagulated. From this viewpoint, the acid value of the polymer is preferably not more than 70, more preferably not more than 50, most preferably not more than 25. When the acid group in the hydrophilic polymer, such as carboxyl group, sulfonic group or phosphoric group, is neutralized with an alkali metal or an amine, the term "acid value" means a value obtained by calculation under the unneutralized condition.

(b) Crosslinking Agent

The crosslinking agent used for crosslinking the hydrophilic polymer of the invention has only to be one which undergoes crosslinking reaction with the hydrophilic polymer to make the hydrophilic polymer water-insoluble and thereby improve the water-resisting qualities of the photosensitive hydrophilic resin layer. Examples of the crosslinking agents include publicly known polyhydroxy compounds, polycarboxylic acid compounds and anhydrides thereof, polyglycidyl compounds, polyamines, polyisocyanate compounds, block isocyanate compounds, epoxy resins, oxazoline resins and amino resins, which react with crosslinking functional groups in the hydrophilic polymer, such as carboxyl group, sulfonic group, hydroxyl group and glycidyl group, and in some cases, amide group.

Of the above-mentioned crosslinking agents, publicly known various aqueous epoxy resins, publicly known oxazoline resins, publicly known amino resins and aqueous block isocyanate compounds are preferably used in the invention, from the viewpoints of curing rate, stability of the photosensitive composition, and balance between the hydrophilicity and the water-resisting qualities of the photosensitive layer. Examples of the amino resins include publicly known melamine resin, urea resin, benzoguanamine resin, glycoluril resin, and modified resins of these resins, such as carboxy-modified melamine resin. In the use of the epoxy resin, tertiary amines may be used in combination, and in the use of the amino resin, acid compounds such as paratoluenesulfonic acid, alkylbenzenesulfonic acids and ammonium chloride may be used in combination, in order to accelerate the crosslinking reaction.

(c) Light Absorbing Compound

The light absorbing compound used for the hydrophilic resin photosensitive layer of the invention has only to be one which absorbs a light to generate heat. There is no specific limitation on the wavelength of the light absorbed, and in the exposure, a light of a wavelength region capable of being absorbed by the light absorbing compound is appropriately used. Examples of the light absorbing compounds include cyanine dye, polymethine dye, phthalocyanine dye, naphthalocyanine dye, anthracyanine dye, porphyrin dye, azo dye, benzoquinone dye, naphthoquinone dye, dithiol metal complex dye, diamine metal complex dye, nigrosine and carbon black.

Of these dyes, a dye which absorbs a light of 750 to 1100 nm is preferable from the viewpoints of handling in a bright room, power of a light source used for the exposure machine, and ease of use. The absorption wavelength region of the dye can be changed by a substituent or the length of the conjugated system of a $\pi$ electron. The light absorbing compound may be dissolved or dispersed in the photosensitive composition.

(d) Hydrophobic Polymer

There is no specific limitation on the hydrophobic polymer used for the photosensitive layer of the invention, and the hydrophobic polymer is a polymer which forms a phase different from the hydrophilic polymer phase in the formation of the photosensitive layer. Examples of the hydrophobic polymers include usual polymers and polymer precursors which undergo polymerization and become polymers in the formation of the photosensitive layer. Of these, preferable are aqueous dispersion polymers, polymers soluble in aqueous solvents and polymer precursors soluble in aqueous solvents, from the viewpoint of ease of blending with the hydrophilic polymer. The term "aqueous" used herein means water alone or a mixed liquid consisting of water as a main component and a solvent compatible with water such as methanol, ethanol or acetone.

The aqueous dispersion polymer means an aqueous dispersion of a hydrophobic polymer, in which fine polymer particles and if necessary polymer particles covered with dispersing agent are dispersed in an aqueous solvent, and is, for example, a polymer prepared by emulsion polymerization or suspension polymerization of an unsaturated monomer, a polymer prepared by dispersing fine particles of a hydrophobic polymer in water, or a polymer obtained by dispersing an organic solvent solution of a hydrophobic polymer to water, optionally followed by distilling off the organic solvent. The aqueous dispersion polymers are divided into self emulsified (dispersion) type and forcibly emulsified (dispersion) type. The aqueous dispersion polymer may be a polymer crosslinked or uncrosslinked.

Examples of the aqueous dispersion polymers include aqueous dispersion vinyl polymers, aqueous dispersion conjugated diene polymers, aqueous dispersion acrylate polymers, aqueous dispersion polyurethane resins, aqueous dispersion polyester resins, and aqueous dispersion epoxy resins.

The average particle diameter of the aqueous dispersion polymer is preferably 0.005 to 0.5 μm, more preferably 0.01 to 0.4 μm, from the viewpoints of resolution of the printing plate, ink repellency and thinning of the photosensitive layer. The film forming temperature of the aqueous dispersion polymer is preferably not higher than 50° C., more preferably not higher than 30° C., from the viewpoint of sensitivity in the irradiation with a light. Particularly preferable are aqueous dispersion acrylate polymers, aqueous dispersion polyurethane resins and aqueous dispersion polyester resins, which have an average particle diameter of 0.005 to 0.5 μm and a film forming temperature of not higher than 50° C. Of these, aqueous dispersion polyurethane resins and aqueous dispersion polyester resins are most preferable.

Examples of the polymer precursors which undergo polymerization and become hydrophobic polymers in the formation of the photosensitive layer include the self polymerizable resins previously exemplified as crosslinking agents, e.g., amino resins and epoxy resins. These resins undergo self-polymerization, and in the polymerization, a catalyst to accelerate the polymerization may be added. A copolymerizable component may be further added. In particular, the amino resin having self polymerizability is soluble in an aqueous solvent, and the polymer resulting from the self-polymerization becomes hydrophobic and functions also as a crosslinking agent of the hydrophilic polymer. In this case, therefore, a hydrophobic polymer phase can be formed even if no hydrophobic polymer is used.

The photosensitive layer containing the hydrophobic polymer of the invention preferably has a phase separation structure consisting of a hydrophilic polymer phase and a hydrophobic polymer phase, and from the viewpoint of ink repellency of the non-image area, it is preferable that the hydrophobic polymer phase is dispersed in the crosslinked hydrophilic polymer phase. The average particle diameter of the aqueous dispersion polymer used as the hydrophobic polymer is in the range of preferably 0.005 to 0.5 μm. When the hydrophobic polymer phase is formed, the polymer particles are sometimes coagulated and become large. In this case, the particle diameter of the dispersed hydrophobic polymer phase is preferably not more than 5 μm, more preferably not more than 3 μm, from the viewpoints of resolution and ink repellency.

The amount of the dispersed hydrophobic polymer phase is preferably large from the viewpoint of ink receptivity of the light irradiated area. However, too large amount of the polymer is unfavorable because scumming takes place. When the hydrophobic polymer has film forming properties independently, use of a large amount of the polymer is unfavorable because the hydrophilic polymer phase is dispersed in the hydrophobic polymer phase.

(e) Compounding Ratio of Photosensitive Composition

The photosensitive hydrophilic resin layer of the invention is obtained by crosslinking the photosensitive composition, and the compounding ratio of the photosensitive composition is as follows.

When the photosensitive hydrophilic resin layer of the invention comprises three components of a hydrophilic polymer, a crosslinking agent and a light absorbing compound, the compounding ratio is as follows.

From the viewpoints of balance between the hydrophilicity and the water-resisting qualities of the photosensitive hydrophilic resin layer and various printing properties, the amount (as solid content) of the hydrophilic polymer is 90 to 40% by weight, preferably 85 to 50% by weight, more preferably 80 to 60% by weight, the amount (as solid content) of the crosslinking agent is 10 to 60% by weight, preferably 15 to 50% by weight, more preferably 20 to 40% by weight, and the amount (as solid content) of the light absorbing compound is 2 to 20 parts by weight based on 100 parts by weight of the total (as solid content) of the hydrophilic polymer, the crosslinking agent and other additives (i.e., all the solid contents in the photosensitive composition except the light absorbing compound).

When the photosensitive hydrophilic resin layer of the invention comprises four components of a hydrophilic polymer, a crosslinking agent, a light absorbing compound and a hydrophobic polymer, the compounding ratio is as follows.

The amount (as solid content) of the hydrophilic polymer is 70 to 20% by weight, preferably 65 to 25% by weight, more preferably 60 to 30% by weight. If a crosslinking agent having self polymerizability, such as amino resin, is used, the crosslinking agent undergoes self-polymerization. As a result, a part of the crosslinking agent remains as it is, apart of the crosslinking agent becomes a hydrophobic polymer, and the crosslinking agent functions as both of the crosslinking agent and the hydrophobic polymer. Hence, the total amount of the crosslinking agent and the hydrophobic polymer is 30 to 80% by weight, preferably 35 to 75% by weight, more preferably 40 to 70% by weight. The amount of the light absorbing compound is 1 to 20 parts by weight, preferably 2 to 15 parts by weight, based on 100 parts of the total (as solid content) of the hydrophilic polymer, the crosslinking agent and the hydrophilic polymer, and other additives.

(2) Formation of Photosensitive Hydrophilic Resin Layer and Process for Producing Printing Plate (i) Formation of Photosensitive Hydrophilic Resin Layer In the formation of the photosensitive water-insoluble hydrophilic resin layer of the invention, a filler to improve various properties can be added to a solution containing the hydrophilic polymer, the crosslinking agent and the light absorbing compound or containing the hydrophilic polymer, the crosslinking agent, the light absorbing compound and the hydrophobic polymer, prior to use. The filler used herein may be organic or inorganic. Further, a low-melting compound or a decomposable compound may be added to promote foaming or to facilitate change to ink receptivity.

In the printing, the unexposed area of the photosensitive water-insoluble hydrophilic resin layer is covered with the fountain solution, and thereby the photosensitive layer repels an ink. In order to improve the receptivity of the fountain solution to the unexposed area, various surface active agents may be added. Examples of the surface active agents include anionic surface active agents, cationic surface active agents, nonionic surface active agents and amphoteric surface active agents.

For forming the photosensitive water-insoluble hydrophilic resin layer, a substrate is coated with a solution comprising the hydrophilic polymer, the crosslinking agent and the light absorbing compound or comprising the hydrophilic polymer, the crosslinking agent, the light absorbing compound and the hydrophobic polymer, and the solution is dried and cured. Although the coating method varies depending upon the viscosity of the coating solution, the coating rate and the like, usually used are, for example, roll coater, blade coater, gravure coater, curtain flow coater, die coater and spraying. For the purpose of anti-foaming of the coating solution or smoothing of the coating film, various additives, such as anti-foaming agent, leveling agent, repelling inhibitor and coupling agent, and fillers, such as titanium oxide, silica and alumina, may be added to the coating solution. After application of the coating solution, the solution is heated to dryness and to crosslink the hydrophilic polymer. The heating temperature is usually about 50 to 200° C. Although there is no specific limitation on the thickness of the photosensitive hydrophilic resin layer, the thickness is desired to be usually about 0.5 to 10 μm.

In the preparation of the printing original plate of the invention, after the photosensitive hydrophilic resin layer is formed, the photosensitive layer may be subjected to calendering, or a film may be laminated onto the photosensitive layer to protect the layer.

(ii) Process for Producing Printing Plate

When the printing original plate of the invention is exposed to a light of a wavelength region absorbed by the light absorbing compound, such as a light of 750 to 1100 nm, the light absorbing compound absorbs the light to generate heat. By the heat generation, the exposed area of the photosensitive hydrophilic resin layer loses hydrophilicity and is changed to ink-receptive. This change varies depending upon the composition, degree of crosslinking, strength and glass transition temperature of the photosensitive hydrophilic resin layer, the type of the hydrophobic polymer phase, the type of the light absorbing compound, and the light irradiation conditions. As for this change, two cases are observed, that is, (1) a case where the hydrophobic polymer phase is mainly foamed, and (2) a case where foaming hardly takes place.

These two cases are described below in detail.

(1) Case where Hydrophobic Polymer Phase is Mainly Foamed

When the hydrophobic polymer phase of the photosensitive layer of the invention contains the crosslinking agent, for example, when the photosensitive layer comprises the hydrophilic polymer, the crosslinking agent and the light absorbing compound or when the photosensitive layer comprises the hydrophilic polymer, the crosslinking agent, the hydrophobic polymer and the light absorbing compound and the amount of the crosslinking agent uses is relatively large, the crosslinking agent also forms a hydrophobic polymer phase as previously described. In this case, there are two presumptions that the crosslinking agent forms the hydrophobic polymer phase independently and that the crosslinking agent containing the hydrophobic polymer forms the hydrophobic polymer phase. In each case, it is presumed that when the hydrophobic polymer phase contains the crosslinking agent as previously described, the hydrophobic polymer phase contains the light absorbing compound, the hydrophobic polymer is crosslinked, and the hydrophobic polymer phase is mainly foamed. The term "foam" used herein means extremely fine protrusions and depressions on the photosensitive layer surface which seem to have been formed by explosion of a gas generated from the hydrophobic polymer phase of the photosensitive layer. As the number of such small protrusions and depressions formed on the irradiated area is increased, the ink receptivity becomes higher.

Although the mechanism of the change to ink-receptive due to foaming is not clear, it is presumed that the surface of the hydrophobic polymer phase in the vicinity of the photosensitive layer surface is covered with the hydrophilic polymer phase and that by the foaming of the hydrophobic polymer phase, the hydrophobic polymer is exposed outside and comes to have a fractal structure which promotes the change to ink-receptive. Therefore, use of the hydrophobic polymer increases the degree of ink receptivity and is preferable. The gas which causes foaming is presumed to be generated as follows: the polymerizable functional groups of the crosslinking agent contained in the hydrophobic polymer phase remain in the photosensitive layer, and these residual functional groups undergo reaction or decomposition to thereby generate a gas.

(2) Case where Foaming Hardly Takes Place

When the hydrophobic polymer phase of the photosensitive layer of the invention is substantially made from the hydrophobic polymer, it is presumed that the hydrophobic polymer phase has thermoplasticity and that the hydrophobic polymer particles are melted by heat and changed to ink-receptive.

In the printing original plate of the invention, the surface of the photosensitive layer is changed from hydrophilic to ink-receptive by irradiation with a light as described previously, and the surface profile of the exposed area is also changed. For example, when foaming takes place, the exposed area is sometimes upheaved rather than the unexposed area. Even after the area is upheaved, the upheaval may be decreased or flattened by application of pressure in the printing. Even when foaming does not take place, a mark of polymer melting caused by heat is observed.

As described above, in the printing original plate of the invention, the light irradiated area of the photosensitive hydrophilic resin layer is changed from hydrophilic to ink-receptive, and receptivity of an ink to the irradiated area remains even if operations of development and wiping-off are not conducted, whereby printing becomes practicable.

There is no specific limitation on the wavelength of a light used for exposure of the printing original plate of the invention, and any light coincident with the absorption wavelength region of the light absorbing compound is employable. For the exposure, high-speed scanning with a focused light is preferable from the viewpoint of exposure rate. A light source that is easily handled and has high power is suitable. From this viewpoint, a laser beam having oscillation wavelength of 750 to 1100 nm is particularly preferable as the light for exposure. For example, a high-power semiconductor laser of 830 nm or a YAG laser of 1064 nm is preferably employed. An exposure machine equipped with such laser has been already on the market as a so-called thermal plate setter (exposure machine).

If the irradiation dose is too much or the amount of the light absorbing compound used is too large in the exposure, a considerably wide area of the photosensitive layer is removed by decomposition or combustion, and the decomposition product is scattered around the irradiated area, so that such exposure should be avoided.

EXAMPLES

The present invention is further described with reference to the following examples, but it should be construed that the invention is in no way limited to those examples.

Examples 1–3

Synthesis of Hydrophilic Polymer

In a 1000 cc flask, 400 g of water was placed, and nitrogen was bubbled to remove the dissolved oxygen, followed by raising the temperature to 80° C. While a nitrogen gas was fed to the flask, a monomer solution consisting of 120 g of acrylamide, 30 g of acrylic acid and 77 g of water and an initiator aqueous solution in which 0.5 g of potassium persulfate was dissolved in 50 g of water were independently dropwise added continuously over a period of 3 hours with maintaining the internal temperature at 80° C. After the dropwise addition was completed, polymerization was continued for 2 hours at 80° C. and then further continued for another 2 hours at 90° C. Finally, 150 g of water was added, and then the pH value was adjusted to 5.0 by the use of a sodium hydroxide aqueous solution, to synthesize an aqueous solution of a hydrophilic polymer.

Photosensitive Composition

Subsequently, the hydrophilic polymer and CYMEL-701 (methoxymethyl melamine resin, available from Mitsui Cytec LTD.) as a crosslinking agent in the amounts (solid content, part(s) by weight) shown in Table 1 were mixed with 1 part by weight of paratoluenesulfonic acid as a curing accelerator and 5 parts by weight of IR-125 (cyanine dye, available from ACROS) as a light absorbing compound, to prepare a photosensitive composition.

TABLE 1

| Example | 1 | 2 | 3 |
|---|---|---|---|
| Hydrophilic polymer (parts by weight) | 75 | 80 | 65 |
| Crosslinking agent (parts by weight) | 25 | 20 | 35 |

Preparation of Printing Original Plate

A polyester film having a thickness of 0.2 mm was coated with the photosensitive composition using a doctor blade. Then, the composition was dried at 120° C. for 3 hours to form a photosensitive layer having a thickness of 2 μm, whereby a printing original plate was prepared. The cross section of the photosensitive layer of the original plate was observed by a scanning electron microscope. As a result, particles of 1 to 2 μm considered to be formed by self-polymerization of the crosslinking agent were observed.

Evaluation

The original plate was scan-irradiated with a semiconductor laser beam of a wavelength of 830 nm with focusing the beam so that the irradiation energy density became 300 mJ/cm$^2$, whereby recording of image information of 200 lines/inch was carried out. The surface and the cross section of the plate were observed by a microscope. As a result, the irradiated area of the hydrophilic resin photosensitive layer was foamed and upheaved in each example.

The exposed plate was set in an offset printing press using a fountain solution, and printing of 10000 sheets was carried out. In the printing plates of Examples 1 to 3, any scumming did not occur on the unirradiated area at all, while an ink was received on the irradiated area sufficiently and the recorded image was reproduced on the printing paper. Even at the end of the printing, any scumming did not occur on the unirradiated area at all, and ink receptivity on the irradiated area was not deteriorated.

Examples 4–6

A hydrophilic polymer was synthesized in the same manner as in the synthesis of a hydrophilic polymer in Example 1, except that an unsaturated monomer shown in Table 2 was used instead of acrylamide. Then, a crosslinking agent and a light absorbing compound shown in Table 2were used in the same amounts as in Example 2 to prepare a photosensitive composition. Subsequently, an aluminum plate having a thickness,of 0.2 mm previously coated with a butyral resin of 2 μm thickness as a primer for the improvement of adhesiveness was coated with the photosensitive composition and heated at 150° C. for 1 hour, to prepare a printing original plate having a photosensitive layer of 2 μm thickness. Using the original plate, recording of image information was carried out in the same manner as in Example 1. The surface and the cross section of the photosensitive layer of the plate were observed by a microscope. As a result, in each example, particles of 1 to 2 μm considered to be formed by self-polymerization of the crosslinking agent were observed in the unirradiated area, and the irradiated area was foamed and upheaved. Using the plate, evaluation of printing was carried out in the same manner as in Example 1. As a result, the recorded image was reproduced on the printing paper finely to the end.

TABLE 2

| Example | 4 | 5 | 6 |
|---|---|---|---|
| Unsaturated monomer | Dimethyl acrylamide | N-vinyl-acetamide | Propyl sulfonate acrylamide |
| Light absorbing compound | VO-naphthalo-cyanine | MA-100 | VO-naphthalo-cyanine |
| Crosslinking agent | CYMEL-701 | UFR-300 | CYMEL-350 |

CYMEL-701, CYMEL-35C: melamine resin (product of Mitsui Cytec LTD.)

UFR-300: urea resin (product of Mitsui Cytec LTD.)

MA-100: carbon black (product of Mitsubishi Carbon K.K.)

Examples 7–9

Synthesis of Hydrophilic Polymer

In a 1000 cc flask, 400 g of water was placed, and nitrogen was bubbled to remove the dissolved oxygen, followed by raising the temperature to 80° C. While a nitrogen gas was fed to the flask, a monomer solution consisting of 90 g of acrylamide, 30 g of acrylic acid, 10 g of hydroxyethyl methacrylate, 20 g of acrylonitrile and 77 g of water and an initiator aqueous solution in which 0.5 g of potassium persulfate was dissolved in 50 g of water were independently dropwise added continuously over a period of 3 hours with maintaining the temperature at 80° C. After the dropwise addition was completed, polymerization was continued for 2 hours at 80° C. and then further continued for another 2 hours at 90° C. Finally, 150 g of water was added, and then the pH value was adjusted to 6.0 by the use of a sodium hydroxide aqueous solution, to synthesize a 20% aqueous solution of a hydrophilic polymer.

Photosensitive Composition

Subsequently, the hydrophilic polymer, CYMEL-701 functioning as a crosslinking agent and as a precursor of a hydrophobic polymer, and OLESTER UD350 (aqueous dispersion urethane resin, available from Mitsui Chemicals, Inc., average particle diameter: about 30 nm) as a hydrophobic polymer in the amounts (solid content, part(s) by weight) shown in Table 3 were mixed with 1 part by weight of paratoluenesulfonic acid as a curing accelerator and 5 parts by weight of IR-125 as a light absorbing compound, to prepare a photosensitive composition.

TABLE 3

| Example | 7 | 8 | 9 |
|---|---|---|---|
| Hydrophilic polymer (parts by weight) | 60 | 50 | 35 |
| CYMEL-701 (parts by weight) | 30 | 30 | 35 |
| OLESTER UD350 (parts by weight) | 10 | 20 | 30 |

Preparation of Printing Original Plane

A polyester film having a thickness of 0.2 mm was coated with the photosensitive composition using a doctor blade. Then, the composition was dried at 120° C. for 3 hours to form a photosensitive layer having a thickness of 2 μm, whereby a printing original plate was prepared.

Evaluation

The original plate was scan-irradiated with a semiconductor laser beam of a wavelength of 830 nm with focusing the beam so that the irradiation energy density became 300 mJ/cm$^2$, whereby recording of image information of 200 lines/inch was carried out. The surface and the cross section of the plate were observed by a microscope. As a result, in the unirradiated area, an island phase of islands-sea structure comprising particles of about 2 to 0.5 μm, considered to be mainly formed from a melamine resin or a melamine resin containing an urethane resin was observed, and in the irradiated area, foaming was observed in the island phase of the melamine resin or the melamine resin containing an urethane resin. In each example, apart of the melamine resin became a crosslinking agent and the remainder became a hydrophobic polymer phase.

The exposed plate was set in an offset printing press using a fountain solution, and printing of 10000 sheets was carried out. In the printing plates of Examples 7 to 9, any scumming did not occur on the unirradiated area at all, while an ink was received on the irradiated area sufficiently and the image drawn was reproduced on the printing paper. Even after printing of 50000 sheets, any scumming did not occur on the unirradiated area at all, and ink receptivity on the irradiated area was not deteriorated.

Examples 10–12

A hydrophilic polymer was synthesized in the same manner as in the synthesis of a hydrophilic polymer in Example 8, except that a half of the acrylamide was replaced with an unsaturated monomer shown in Table 4. Then, a compound functioning as a crosslinking agent and as a hydrophobic polymer precursor (a crosslinking agent) and a hydrophobic polymer shown in Table 4 were used in the same amounts as in Example 8 to prepare a photosensitive composition. Subsequently, an aluminum plate having a thickness of 0.2 mm previously coated with a butyral resin of 2 μm thickness as a primer for the improvement of adhesiveness was coated with the photosensitive composition and heated at 150° C. for 1 hour, to prepare a printing original plate having a photosensitive layer of 2 μm thickness. Using the plate, drawing of image information and evaluation of printing were carried out in the same manner as in Example 7. In each example, in the unirradiated area, an island phase of islands-sea structure having particles of about 2 to 0.5 μm was observed, and in the irradiated area, foaming was observed in the island phase. As a result of printing, any scumming did not occur on the unirradiated area at all, while an ink was received on the irradiated area sufficiently and the image drawn was reproduced on the printing paper. Even after printing of 50000 sheets, any scumming did not occur on the unirradiated area, and ink receptivity on the irradiated area was not deteriorated.

TABLE 4

| Example | 10 | 11 | 12 |
|---|---|---|---|
| Unsaturated monomer | Dimethyl acrylamide | N-vinyl-formamide | Propyl sulfonate acrylamide |
| Crosslinking agent | CYMEL-385 | MYCOAT 105 | CYMEL-202 |
| Hydrophobic polymer | OLESTER UD-500 | BONRON S-224 | BONRON S-1318 |

CYMEL-385, CYMEL-202: melamine resin (product of Mitsui Cytec LTD.)

MYCOAT 105: benzoguanamine resin (product of Mitsui Cytec LTD.)

OLESTER UD-500: aqueous dispersion urethane resin (product of Mitsui Chemicals, Inc.)

BONRON S-224, BONRON S-1318: acrylate copolymer emulsion (product of Mitsui Chemicals, Inc.)

Examples 13–16

Synthesis of Hydrophilic Polymer

In a 1000 cc flask, 400 g of water was placed, and nitrogen was bubbled to remove the dissolved oxygen, followed by raising the temperature to 80° C. While a nitrogen gas was fed to the flask, a monomer solution consisting of 86.2 g of acrylamide, 15.8 g of Latemul S-180 (available from Kao Corporation, ester of monoalkyl sulfosuccinate and a compound having allyl group), 18.0 g of hydroxyethyl methacrylate and 122 g of water and an initiator aqueous solution in which 1.0 g of potassium persulfate was dissolved in 100 g of water were independently dropwise added continuously over a period of 2 hours with maintaining the internal temperature at 80° C. After the dropwise addition was completed, polymerization was continued for 3 hours at 80° C. Finally, 50 g of water was added to synthesize a 15% aqueous solution of a hydrophilic polymer. The acid value of the hydrophilic polymer was 17.

Photosensitive Composition

Subsequently, the hydrophilic polymer, CYMEL-385 as a crosslinking agent, Superflex 410 (aqueous dispersion urethane resin, available from Dai-ichi Kogyo Seiyaku K.K., film forming temperature: 5° C. or below, average particle diameter: 0.20 μm) as a hydrophobic polymer, and IR-125 as a light absorbing compound in the amounts (solid content, part(s) by weight) shown in Table 5 were mixed with 1 part by weight of paratoluenesulfonic acid as a curing accelerator and 0.3 part by weight of NEOCOLYSK (anionic surface active agent, available from Dai-ichi Kogyo Seiyaku K.K.), to prepare a photosensitive composition.

TABLE 5

| | Hydrophilic polymer | Crosslinking agent | Light absorbing compound | Hydrophobic polymer |
|---|---|---|---|---|
| Ex. 13 | 40 | 10 | 10 | 50 |
| Ex. 14 | 30 | 10 | 10 | 60 |
| Ex. 15 | 40 | 15 | 10 | 45 |
| Ex. 16 | 45 | 15 | 15 | 40 |

Preparation of Printing Original Plate

A polyester film having a thickness of 0.2 mm was coated with the photosensitive composition using a doctor blade. Then, the composition was dried at 120° C. for 15 minutes to form a photosensitive layer having a thickness of 2 μm, whereby a printing original plate was prepared.

Evaluation

The cross section of the original plate was observed by a scanning electron microscope. As a result, an island phase of islands-sea structure having a particle diameter of about 0.2 μm, considered to be mainly formed from an urethane resin was observed, and presence of a phase separation structure was confirmed.

The original plate was scan-irradiated with a semiconductor laser beam of a wavelength of 830 nm with focusing the beam so that the irradiation energy density became 200 mJ/cm$^2$, whereby drawing of image information of 200 lines/inch was carried out.

The exposed plate was set in an offset printing press using a fountain solution, and printing of 10000 sheets was carried out. In the printing plates of Examples 13 to 16, any scumming did not occur on the unirradiated area at all, while an ink was received on the irradiated area sufficiently and the image drawn was reproduced on the printing paper. Even after printing of 20000 sheets, any scumming did not occur on the unirradiated area, and ink receptivity on the irradiated area was not deteriorated.

Examples 17–19

A printing original plate was prepared in the same manner as in Example 13, except that the hydrophilic polymer was replaced with a polymer shown in Table 6. Then, drawing and evaluation of printing were carried out in the same manner as in Example 13.

TABLE 6

| | Hydrophilic polymer |
|---|---|
| Ex. 17 | Acrylamide/acrylic acid/hydroxyethyl methacrylate copolymer<br>A Ratio of Composition: 84/1/15 (by weight)<br>Acid value: 8 |
| Ex. 18 | Acrylamide/hydroxyethyl methacrylate copolymer<br>A Ratio of Composition: 85/15 (by weight)<br>Acid value: 0 |
| Ex. 19 | Acrylamide/N-vinylformamide/hydroxyethyl methacrylate copolymer<br>A Ratio of Composition: 75/10/15 (by weight)<br>Acid value: 0 |

In each of the photosensitive layers of Examples 17 to 19, a phase separation structure wherein an island phase was formed from the hydrophobic polymer was observed, and even after printing of not less than 20000 sheets was carried out, any scumming did not occur on the unirradiated area at all, while an ink was received on the irradiated area sufficiently and the image drawn was reproduced on the printing paper.

Examples 20–21

A printing original plate was prepared in the same manner as in Example 18, except that the hydrophobic polymer was replaced with a polymer shown in Table 7. Then, drawing and evaluation of printing were carried out in the same manner as in Example 18.

TABLE 7

| | Hydrophobic polymer |
|---|---|
| Ex. 20 | Olester UD350 (aqueous dispersion urethane resin, available from Mitsui Chemicals, Inc.)<br>Particle diameter: 0.03 μm<br>Film forming temperature: 5° C. or below |
| Ex. 21 | VYLONAL MD-1480 (aqueous dispersion polyester resin, available from Toyobo Co., Ltd.)<br>Particle diameter: 0.08 μm<br>Film forming temperature: 10° C. |

In each of the photosensitive layers of the above plates, a phase separation structure wherein an island phase was formed from the hydrophobic polymer was observed.

In the printing plates of Examples 20 and 21, even after printing of not less than 10000 sheets was carried out, any scumming did not occur on the unirradiated area at all, while an ink was received on the irradiated area sufficiently and the image drawn was reproduced on the printing paper.

INDUSTRIAL APPLICABILITY

In the lithographic printing original plate using a fountain solution, a photosensitive water-insoluble hydrophilic resin layer is formed. By the irradiation of the photosensitive layer with a light to change the layer from hydrophilic to ink-receptive, a printing plate which does not need operations of development and wiping-off and is excellent in hydrophilicity, water-resisting properties, ink repellency, sensitivity, resolution and printability can be provided.

What is claimed is:

1. A lithographic printing original plate having a photosensitive layer on a substrate directly or on another layer provided thereon, said photosensitive layer being comprised of a crosslinked polymer having ink repellency, wherein the photosensitive layer is a water-insoluble photosensitive hydrophilic resin layer obtained by crosslinking a photosensitive composition consisting essentially of a hydrophilic polymer, a crosslinking agent, a hydrophobic polymer and a light absorbing compound, wherein the photosensitive hydrophilic resin layer has a phase-separation structure comprised of a hydrophilic polymer phase comprised of a crosslinked hydrophilic polymer and a hydrophobic polymer phase comprised of a hydrophobic polymer, and wherein the photosensitive layer is changed from being ink-repellant to ink-receptive by irradiation with light whereby the plate is without need of developing the unexposed areas of the photosensitive layer with a fountain solution during printing.

2. The lithographic printing original plate as claimed in claim 1, wherein the photosensitive layer is locally foamed by irradiation with a light and changed from ink-repellant to ink-receptive.

3. A process for producing a lithographic printing plate, comprising irradiating the lithographic printing original plate of claim 2 with a light having a wavelength of 750 to 1100 nm.

4. The lithographic printing original plate as claimed in claim 1, wherein the photosensitive layer is locally heat melted by irradiation with a light and changed from ink-repellent to ink-receptive.

5. The lithographic printing original plate as claimed in claim 1, wherein the hydrophilic polymer is a polymer having an amide group.

6. The lithographic printing original plate as claimed in claim 1, wherein the hydrophilic polymer comprises one or more monomers selected from the group consisting of unsubstituted or substituted (meth)acrylamide, N-vinylformamide and N-vinylacetamide.

7. A lithographic printing original plate having a photosensitive layer on a substrate directly or on another layer provided thereon, said photosensitive layer being comprised of a crosslinked polymer having ink repellency, wherein the photosensitive layer is a water-insoluble photosensitive hydrophilic resin layer obtained by crosslinking a photosensitive composition consisting essentially of a hydrophilic polymer, a crosslinking agent, a light absorbing compound and a hydrophobic polymer, and wherein the photosensitive layer is locally foamed by irradiation with a light and changed from ink-repellant to ink-receptive.

8. The lithographic printing original plate as claimed in claim 7, wherein the hydrophilic polymer is a polymer containing as a main component one or more monomers selected from unsubstituted or substituted (meth)acrylamide, N-vinylformamide and N-vinylacetamide, the hydrophobic polymer is an aqueous dispersion polymer having an average particle diameter of 0.005 to 0.5 μm and a film forming temperature of not higher than 50° C., and the photosensitive hydrophilic resin layer has a phase separation structure consisting of a hydrophilic polymer phase and a hydrophobic polymer phase.

9. A process for producing a lithographic printing plate, comprising irradiating the lithographic printing original plate of claim 8 with a light having a wavelength of 750 to 1100 nm.

10. The lithographic printing original plate as claimed in claim 8, wherein the photosensitive layer is locally heat melted by irradiation with a light and changed from ink-repellent to ink-receptive.

11. The lithographic printing original plate as claimed in claim 7, wherein the hydrophobic polymer has an average particle diameter of 0.005 to 0.5 μm.

12. The lithographic printing original plate as claimed in claim 7, wherein the hydrophobic polymer is an aqueous dispersion polymer having a film forming temperature of not higher than 50° C.

13. A lithographic printing original plate having a photosensitive layer on a substrate directly or on another layer provided thereon, said photosensitive layer being comprised of a crosslinked polymer having ink repellency, wherein the photosensitive layer is a water-insoluble photosensitive hydrophilic resin layer obtained by crosslinking a photosensitive composition consisting essentially of a hydrophilic polymer, a crosslinking agent, a light absorbing compound and a hydrophobic polymer, and wherein the photosensitive layer is locally heat melted by irradiation with a light and changed from ink-repellant to ink-receptive.

14. The lithographic printing original plate as claimed in claim 13, wherein the hydrophobic polymer has an average particle diameter of 0.005 to 0.5 μm.

15. The lithographic printing original plate as claimed in claim 13, wherein the hydrophobic polymer is an aqueous dispersion polymer having a film forming temperature of not higher than 50° C.

* * * * *